(12) United States Patent
Trimberger

(10) Patent No.: US 8,296,604 B1
(45) Date of Patent: Oct. 23, 2012

(54) METHOD OF AND CIRCUIT FOR PROVIDING TEMPORAL REDUNDANCY FOR A HARDWARE CIRCUIT

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 344 days.

(21) Appl. No.: 12/577,681

(22) Filed: Oct. 12, 2009

(51) Int. Cl.
*G06F 11/00* (2006.01)

(52) U.S. Cl. .......................... 714/21; 714/700; 714/726

(58) Field of Classification Search .................. None
See application file for complete search history.

(56) References Cited

U.S. PATENT DOCUMENTS

| | | | |
|---|---|---|---|
| 5,124,588 A * | 6/1992 | Baltus et al. ............... | 326/38 |
| 6,453,431 B1 * | 9/2002 | Bernstein et al. ............ | 714/700 |
| 7,506,230 B2 * | 3/2009 | Chu et al. .................. | 714/726 |
| 2011/0022909 A1 * | 1/2011 | Wang et al. ................ | 714/726 |

OTHER PUBLICATIONS

U.S. Appl. No. 11/732,782, filed Apr. 4, 2007, Bridgford, Brendan K., XILINX, Inc., 2100 Logic Drive, San Jose, CA.

* cited by examiner

*Primary Examiner* — Scott Baderman
*Assistant Examiner* — Jason Bryan
(74) *Attorney, Agent, or Firm* — John J. King

(57) ABSTRACT

A method and circuit for providing temporal redundancy for a hardware circuit implemented in an integrated circuit is disclosed. The method comprises implementing a comparison circuit for comparing values in the integrated circuit; coupling an input signal to the hardware circuit; detecting an output signal of the hardware circuit at a first time, wherein the output signal is based upon the input signal; holding the input signal until at least a second time; detecting the output signal of the hardware circuit at the second time; determining, by the comparison circuit, whether the output signal of the hardware circuit at the first time corresponds to the output signal of the hardware circuit at the second time; and generating an error signal based upon determining whether the output signal of the hardware circuit at the first time corresponds to the output signal of the hardware circuit at the second time.

16 Claims, 8 Drawing Sheets

METHOD OF AND CIRCUIT FOR PROVIDING TEMPORAL REDUNDANCY FOR A HARDWARE CIRCUIT

FIELD OF THE INVENTION

One or more embodiments of the present invention relate generally to integrated circuits, and in particular, to a method of and circuit for providing temporal redundancy for a hardware circuit in an integrated circuit.

BACKGROUND OF THE INVENTION

Integrated circuits are used to implement a variety of applications. However, certain applications, such as military, aerospace, and some communications applications, must be highly reliable. Therefore, redundant circuits are often employed. While duplicating a circuit in a device will enable error detection, triple module redundancy (TMR) is a redundancy technique for ensuring that a circuit functions even if one of the circuits is not operating properly, where corresponding values output by the remaining two circuits will ensure that the output of the circuit is correct.

However, implementing a circuit with redundancy can be expensive because it requires that a circuit be implemented multiple times. Temporal redundancy has been proposed in software for finding soft errors. That is, a given calculation is run twice, and the two runs are compared. Temporal redundancy in a software application requires no additional hardware, but does take twice the time. Implementing any type of redundancy in a hardware application according to conventional methods requires multiple implementations of a hardware circuit. While such redundancy of hardware may be acceptable for some systems, the additional area required for redundant circuits may significantly reduce the available space on the integrated circuit for implementing circuits.

SUMMARY OF THE INVENTION

A method of providing temporal redundancy for a hardware circuit implemented in an integrated circuit is disclosed. The method comprises implementing a comparison circuit for comparing values in the integrated circuit; coupling an input signal to the hardware circuit; detecting an output signal of the hardware circuit at a first time, wherein the output signal is based upon the input signal; holding the input signal until at least a second time; detecting the output signal of the hardware circuit at the second time; determining, by the comparison circuit, whether the output signal of the hardware circuit at the first time corresponds to the output signal of the hardware circuit at the second time; and generating an error signal based upon determining whether the output signal of the hardware circuit at the first time corresponds to the output signal of the hardware circuit at the second time.

Detecting the output signal of the hardware circuit at the first time and detecting the output signal of the hardware circuit at the second time according to the method may comprises detecting the output signal based upon first and second clock pulses of a first clock signal, or detecting the output signal based upon a clock pulse of a first clock signal by detecting the output signal of the hardware circuit based upon a clock pulse of a first clock signal and detecting the output signal of the hardware circuit at the second time by detecting the output signal based upon a clock pulse of a second clock signal.

Detecting the output signal of the hardware circuit at the first time and detecting the output signal of the hardware circuit at the second time may comprise detecting values stored in a plurality of registers coupled in series to receive the output signal of the hardware circuit, or detecting values stored in parallel registers coupled to receive the output signal of the hardware circuit. The parallel registers may comprise three registers, and the method may further comprise holding the input signal until at least a third time and detecting an output signal of the hardware circuit at the third time to provide an output value based upon a majority rule.

According to an alternate embodiment, a method of providing temporal redundancy for a hardware circuit implemented in an integrated circuit comprises implementing a comparison circuit for comparing values in the integrated circuit; coupling an input signal to a state machine implemented in hardware in the integrated circuit; detecting a state value of the state machine at a first time based upon the input signal coupled to the state machine; holding the input signal until at least a second time; detecting the state value at the second time; determining, by the comparison circuit, whether the state value of the state machine at the first time corresponds to the state value of the state machine at the second time; and generating an error signal based upon determining whether the state value of the state machine at the first time corresponds to the state value of the state machine at the second time.

Detecting the state value of the state machine at the first time and at the second time according to the alternate embodiment of the invention may comprise detecting the state value based upon first and second clock pulses of a clock signal. Alternatively, detecting the state value of the state machine at the first time comprises detecting the state value based upon a first clock pulse of a first clock signal and detecting the state value of the state machine at the second time comprises detecting the state value based upon a second clock pulse of a second clock signal.

Further, detecting the state value of the state machine at the first time and detecting the state value of the state machine at the second time may comprise detecting values stored in a series of registers coupled to receive the state value of the state machine. Alternatively, detecting the state value of the state machine at the first time and detecting the state value of the state machine at the second time may comprise detecting values stored in parallel registers coupled to receive the state value of the state machine. The state value of the state machine at the first time may be compared to the state value of the state machine at the second time. The method may further comprise holding the input signal until a third time and determining the state of the state machine at the third time to provide an output value based upon a majority rule of the state values stored in the parallel registers at the first, second and third times.

A circuit for providing temporal redundancy for a hardware circuit implemented in an integrated circuit is also disclosed. The circuit comprises an input of the hardware circuit coupled to receive an input signal; a first register coupled to receive a signal generated by the hardware circuit at a first time based upon the input signal; a second register coupled to receive the signal generated by the hardware circuit at a second time, wherein the input signal coupled to the input of the hardware circuit at the first time is held at least until the second time; and a comparison circuit coupled to the first register and the second register, wherein the comparison circuit generates an error signal based upon a comparison of the signal generated by the hardware circuit at the first time and the signal generated by the hardware circuit at the second time.

The first register and the second register may be coupled in series or in parallel. The circuit may further comprise a third register coupled to receive the signal generated by the hardware circuit based upon the input at a third time, wherein the comparison circuit may comprise a voter circuit coupled to the first, second and third registers and may generate a majority vote output based upon values in the first, second and third registers. The hardware circuit may comprise a state machine and the signal generated by the hardware circuit is a state output of the state machine, while the integrated circuit may comprise a device having programmable logic and the hardware circuit may be implemented in programmable logic of the device.

DETAILED DESCRIPTION OF THE DRAWINGS

Figure 1:
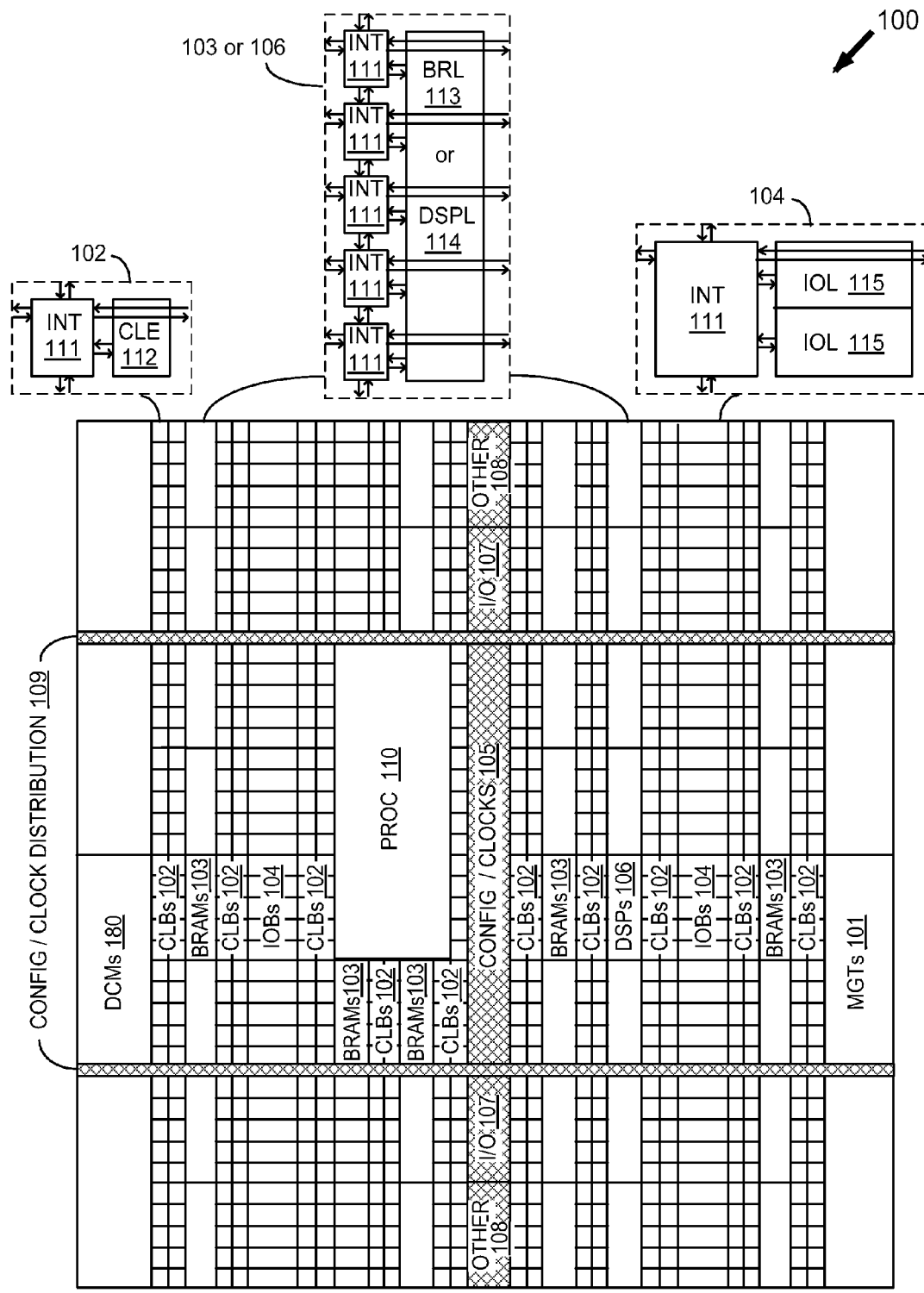
FIG. 1 is a block diagram of an integrated circuit device according to an embodiment the present invention.

Turning first to FIG. 1, a block diagram of an integrated circuit device having programmable resources according to an embodiment the present invention is shown. While devices having programmable resources may be implemented in any type of integrated circuit device, such as an application specific integrated circuit (ASIC) having programmable resources, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL) 114 in addition to an appropriate number of programmable interconnect elements. An 10B 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
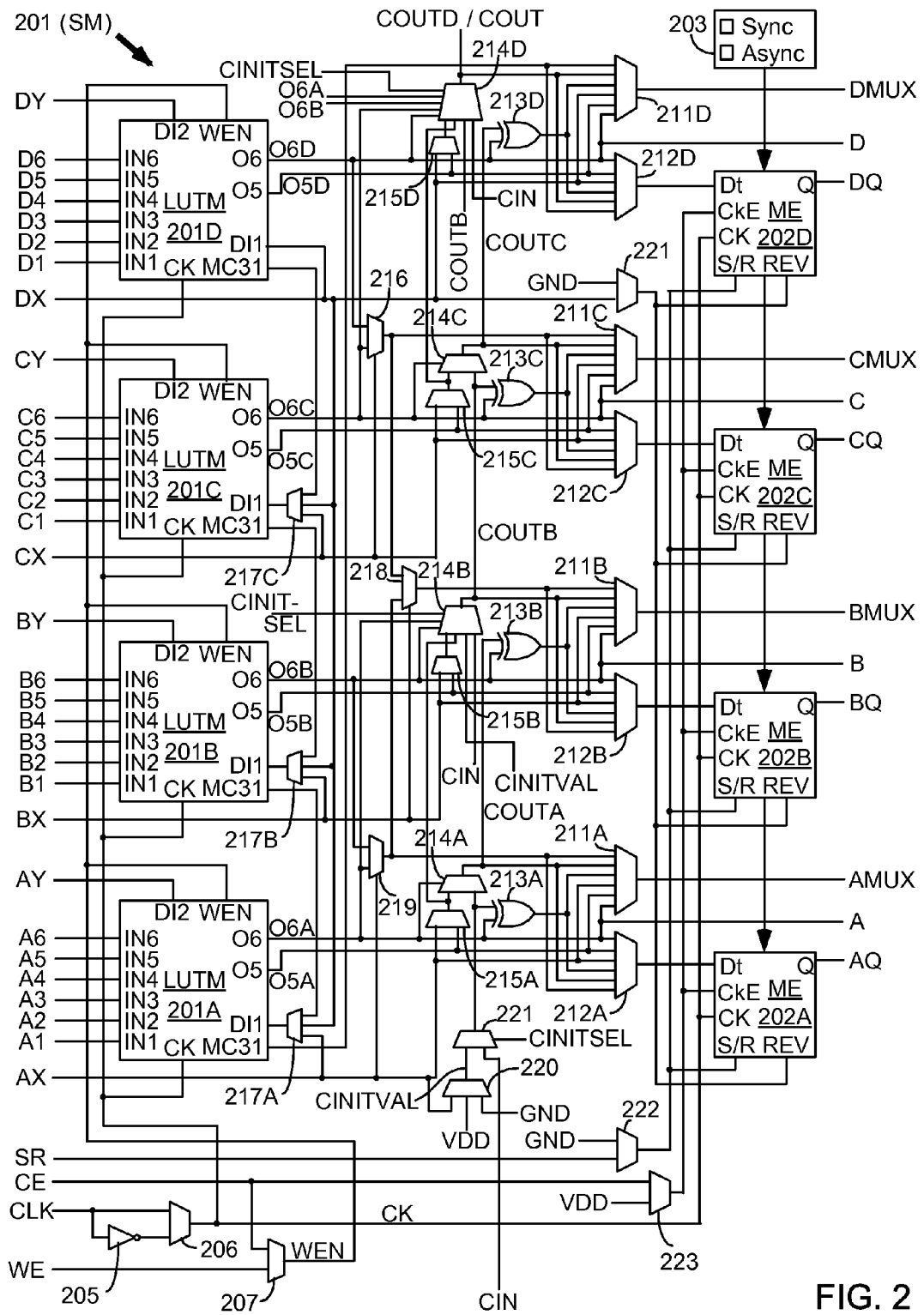
FIG. 2 is a block diagram of configurable element of the integrated circuit of FIG. 1 according to an embodiment of the present invention.

Turning now to FIG. 2, a block diagram of configurable element of the integrated circuit of FIG. 1 according to an embodiment of the present invention is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M 201 also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic comprising multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX.

Figure 3:
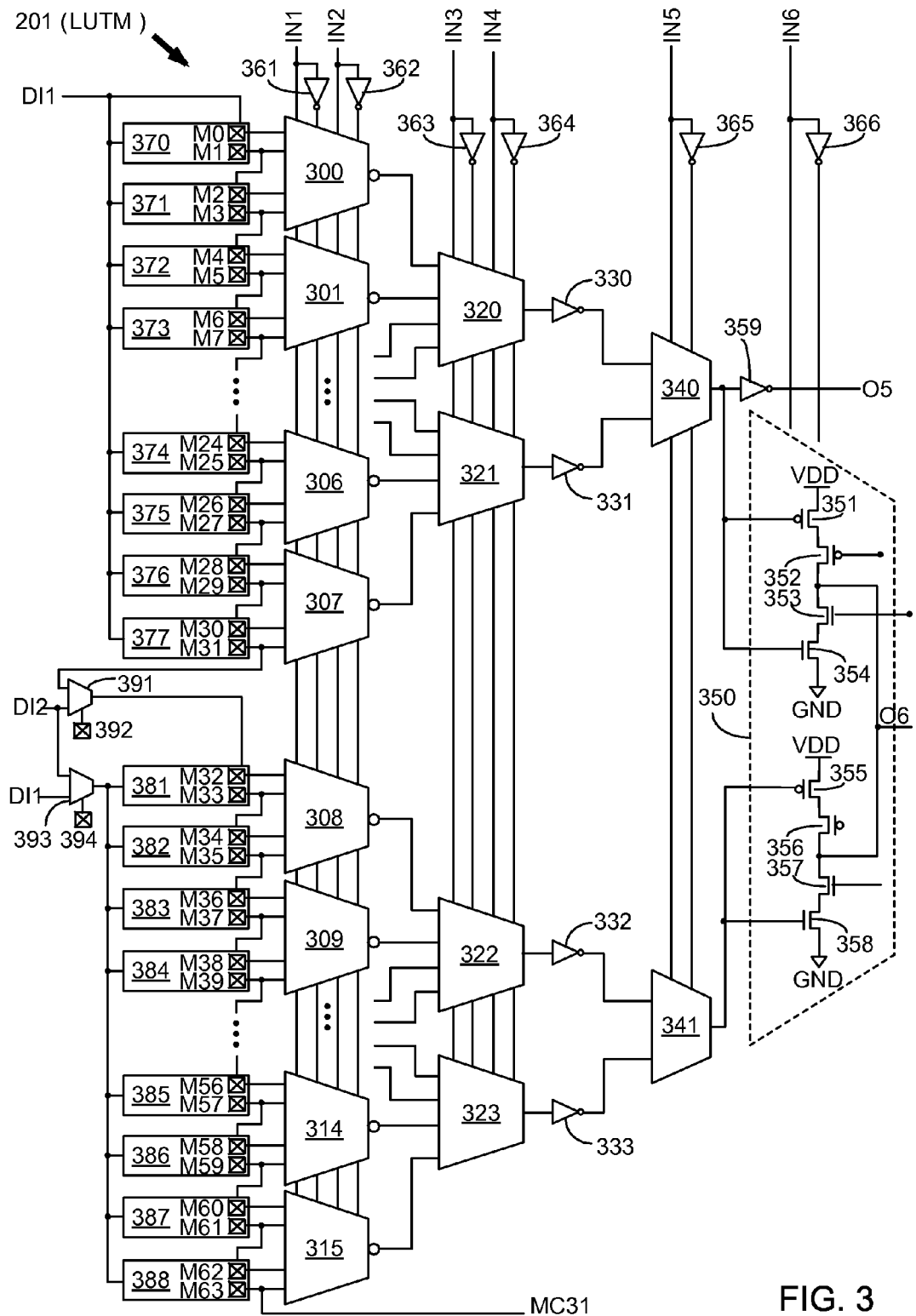
FIG. 3 is a block diagram of a lookup table according to an embodiment of the present invention.

Turning now to FIG. 3, a block diagram of a lookup table according to an embodiment of the present invention is shown. In the embodiment of FIG. 3, configuration memory cells M0-M63 drive 4-to-1 multiplexers 300-315, which are controlled by input signals IN1, IN2 and their inverted counterparts (provided by inverters 361, 362) to select 16 of the signals from the configuration memory cells. The selected 16 signals drive four 4-to-1 multiplexers 320-323, which are controlled by input signals IN3, IN4 and their inverted counterparts (provided by inverters 363, 364) to select four of the signals to drive inverters 330-333. Inverters 330-333 drive 2-to-1 multiplexers 340-341, which are controlled by input signal IN5 and its inverted counterpart (provided by inverter 365). The output of multiplexer 340 is inverted by inverter 359 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 3 shows bubbles on the output terminals of multiplexers 300-315, which signifies an inversion (e.g., an inverter) on the output of each of these multiplexers.

Multiplexers 340 and 341 both drive data input terminals of multiplexer 350, which is controlled by input signal IN6 and its inverted counterpart (provided by inverter 366) to select either of the two signals from multiplexers 340-341 to drive output terminal O6. Thus, output signal O6 can either provide any function of up to five input signals IN1-IN5 (when multiplexer 350 selects the output of multiplexer 341, i.e., when signal IN6 is high), or any function of up to six input signals IN1-IN6.

In the pictured embodiment, multiplexer 350 is implemented as two three-state buffers, where one buffer is driving and the other buffer is disabled at all times. The first buffer includes transistors 351-354, and the second buffer includes transistors 355-358, coupled together as shown in FIG. 3. Additional logic circuits are added to add the optional shift register and RAM functionality. The additional logic includes memory circuits 370-388, multiplexers 391, 393, and configuration memory cells 392, 394. Memory circuits 370-388 store the shift values or RAM values, while multiplexers 391, 393 are controlled by memory cells 392, 394 to select shift data and/or RAM input data.

Figure 4:
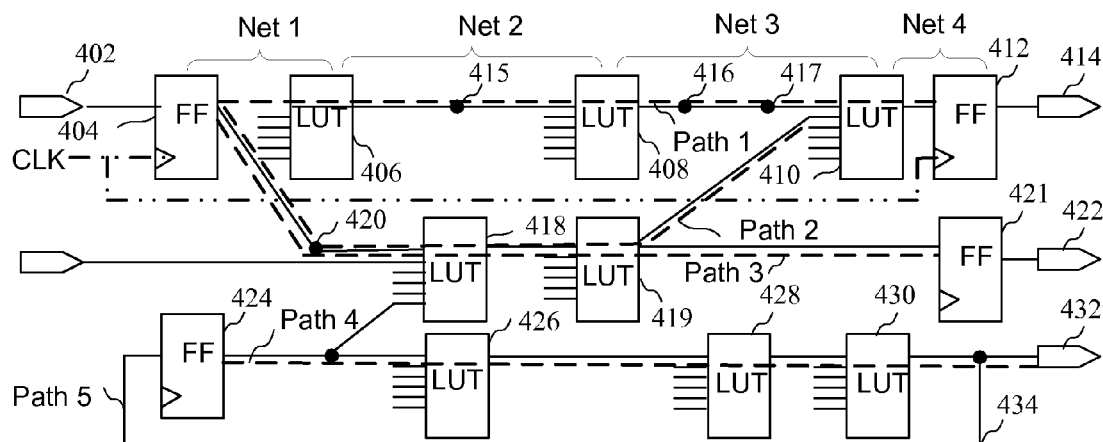
FIG. 4 is a block diagram of circuit elements for implementing a logic circuit according to an embodiment of the present invention.

Turning now to FIG. 4, a block diagram of circuit elements for implementing a logic circuit according to an embodiment of the present invention is shown. FIG. 4 is a block diagram showing connections between elements of an integrated circuit device which may be used to implement a hardware circuit as a state machine according to an embodiment of the present invention. While a circuit may be implemented in hardware, some circuits implemented in hardware, such as a processor 110 of FIG. 1, execute software applications. In contrast, a hardware circuit according to an embodiment of the present invention may be implemented in hardware elements for enabling a hardware application, such as a logic circuit or state machine implemented in CLBs as described above with reference to FIGS. 2-3 and described in more detail below. The block diagram of a circuit of hardware elements for implementing a hardware application of FIG. 4 shows a device having registers, shown here as flip-flops (FFs), and may include other elements, such as lookup tables (LUTs) of CLBs. The registers receive data signals and clock signals as shown, and various nets and paths are coupled by interconnect lines between registers. The connections between elements of the circuit may be defined in terms of nets and paths. A net represents a collection of interconnect segments from the output of a user logic block such as a lookup table to inputs of the next destination user logic block. A path represents a sequence of nets between registers and includes a connection from a source register to a load register. A path may be defined as a clock-to-clock path, such as a path from one register to another register, a register to an output, an input to a register, or an input to an output, as is well known in the art. While FIG. 4 is shown in terms of lookup tables, it should be understood that other logic blocks may be used.

Referring specifically to FIG. 4, an input/output (I/O) port 402, which may include an input for receiving data, is coupled to an input of a register 404, the output of which is coupled to an input of a LUT 406. While some inputs of LUTs and registers in FIG. 4 are shown without nets attached, these nets may connect to other LUTs or flip-flops (FFs), but are omitted for clarity. The output of the LUT 406 is coupled to a second LUT 408, the output of which is coupled to a third LUT 410. The output of the LUT 410 is coupled to a register 412, which is coupled to an I/O port 414.

Accordingly, there are 4 nets associated with a Path 1 which extends from register 404 to register 412 by way of LUT 406, LUT 408 and LUT 410. In particular, a first net (Net1) is defined between register 404 and the LUT 406. A second net (Net 2) is defined between LUT 406 and LUT 408, and includes one interconnect point 415 connecting two interconnect segments. The interconnect point may include a programmable interconnect point (PIP), which may be a programmable multiplexing network. A third net (Net3) extending from the LUT 408 to the LUT 410 includes two interconnect points 416 and 417 connecting interconnect segments. Finally, a fourth net is defined between the LUT 410 and the register 412.

A second path, Path 2, between the register 404 and the register 412 is shown extending through LUTs 418 and 419 by way of an interconnect point 420, and back to LUT 410. While Path 1 and Path 2 have the same number of LUTs between the same registers, they extend through different LUTs and interconnect points. Accordingly, Path 1 and Path 2 may have different delays. A third path, Path 3, extends from register 404, through LUTs 418 and 419 to a register 421, the output of which is coupled to an I/O port 422. Finally, the output of a register 424 is coupled by way of LUTs 426-430 to an I/O port 432, as shown by Path 4. A feedback loop 434 is also shown, which would be considered a separate path, designated as Path 5. The interconnect points provide input flexibility between a general interconnect structure of the integrated circuit device and configurable elements, such as the LUTs in FIG. 4.

The circuits and methods of the present invention may be implemented according to the device of FIGS. 1-4, or in any device, including any type of integrated circuit having programmable logic. That is, the logic circuits and state machines described below may be implemented according to the arrangement of circuits as described in FIGS. 1-4, for example.

Figure 5:
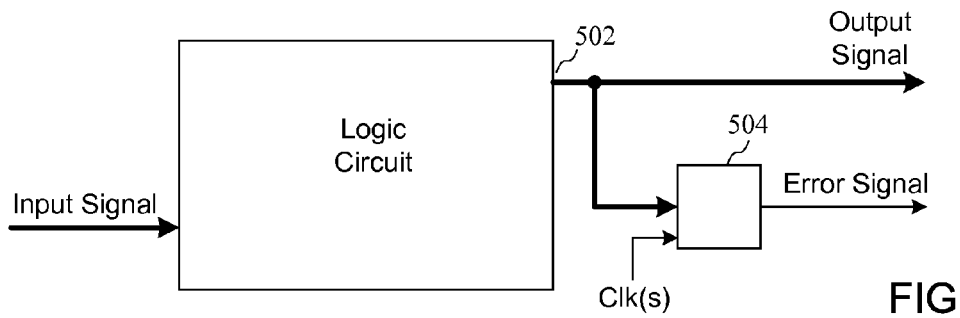
FIG. 5 is a block diagram of a circuit for providing temporal redundancy for a hardware circuit implemented in an integrated circuit according to an embodiment of the present invention.
Figure 6:
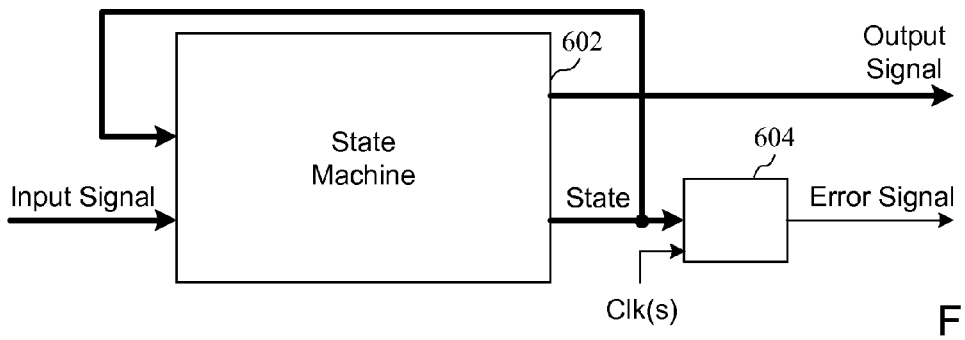
FIG. 6 is a block diagram of a circuit for providing temporal redundancy for a state machine implemented in an integrated circuit according to an embodiment the present invention.

Turning now to FIG. 5, a block diagram of a circuit for providing temporal redundancy for a hardware circuit implemented in an integrated circuit according to an embodiment of the present invention is shown. In order to provide temporal redundancy for a circuit implemented in hardware, an error detection circuit will detect the output of logic circuit at different times and generate an error signal based upon a comparison of the signals detected at different times. In particular, a logic circuit 502, which may be implemented in hardware elements for implementing a hardware application such as those described in the circuits of FIGS. 1-4, is coupled to receive an input signal. It should be noted that the heavy lines in FIGS. 5-12 generally denote multi-bit signals, while the light lines, such as the clock or error signals, denote single bit signals. An output signal of the logic circuit is coupled to an error detection circuit 504. As will be described in more detail below, the error signal will be generated based upon a comparison of the output of the logic circuit 502 at different times based upon one or more clock signals used to capture the output signal at different times.

A particular type of hardware circuit may be a state machine implemented using hardware elements. According to the embodiment of FIG. 6, a state machine 602 is coupled to receive an input signal, while the state of the state machine 602 is coupled to an error detection circuit 604. That is, rather than analyzing the output of the state machine 602, the circuit of the embodiment of FIG. 6 analyzes the state value of the state machine to generate an error signal. A state machine defines a model of behavior associated with a number of states and transitions between those states, as is well known in the art. A transition indicates a state change defined by a state value and is described by a condition that would need to be fulfilled to enable the transition. An output signal is generated by the state machine in response to the transition form a current state to a next state.

Figure 7:
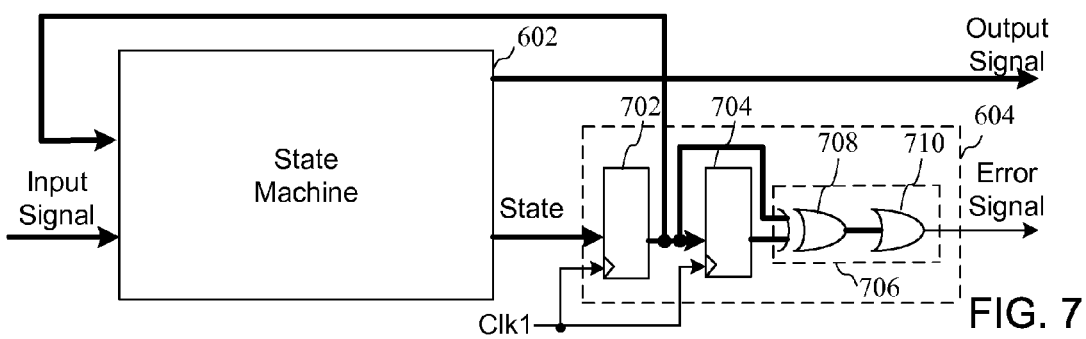
FIG. 7 is a block diagram of a circuit coupled to receive a single clock signal and provide temporal redundancy for a state machine implemented in an integrated circuit according to an embodiment of the present invention.

Turning now to FIG. 7, a block diagram of a circuit coupled to receive a single clock signal and provide temporal redundancy for a state machine implemented in an integrated circuit according to an embodiment of the present invention is shown. According to the embodiment of FIG. 7, the state machine 602 is run twice so that the state of the state machine 602 is stored twice. In particular, the error detection circuit 604 comprises a first register 702 and second register 704, each of which is clocked by a first clock signal, Clk1. The first register 702 and second register 704 are used to detect transients on the state value. After running the state machine 602 twice, the values stored in the first register 702 and the second register 704 should be the same and can be compared by a comparator circuit 706 coupled to the outputs of each of the registers. In an embodiment, first register 702 may be the state register of a sequential state machine. According to the embodiment of FIG. 7, the comparator circuit 706 comprises an "exclusive or" (XOR) circuit 708 coupled to receive the output of the registers. The outputs of the XOR circuit 708 are coupled to an "or" (OR) circuit 710 which generates a single bit error signal. The XOR circuit 708 as shown in FIG. 7 comprises a plurality of XOR circuits which will compare a bit of the state value at two given times, and generate an error signal if any bit of the state value does not have values which correspond during at least two different time periods. That is, the OR gate 710 will generate an error signal if the result of any comparison of a bit at two different times results in an error. The comparator circuit 706 as shown is one example of a comparator circuit which could be implemented to generate the error signal. However, it should be understood that other comparator circuits could be implemented according to one or more other embodiments of the present invention. While the embodiment of FIG. 7 provides temporal redundancy with a low hardware overhead, there is a time penalty with running the state machine twice using the same clock signal. That is, because the state variable is re-computed every other cycle, the state machine operates at half the speed. As will be described in more detail below, multiple clock signals may be used in a circuit to provide temporal redundancy and which generates an error signal with a lower time penalty.

Figure 8:
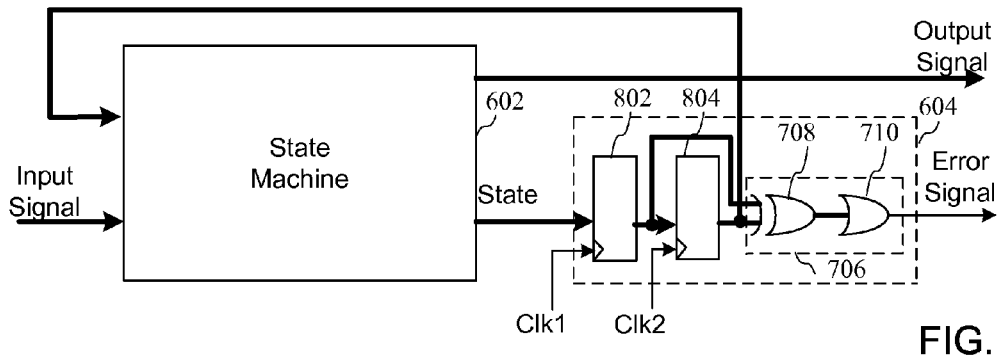
FIG. 8 is a block diagram of a circuit coupled to receive a plurality of clock signals and provide temporal redundancy for a state machine implemented in an integrated circuit according to an embodiment the present invention.

Turning now to FIG. 8, a block diagram of a circuit coupled to receive a plurality of clock signals and provide temporal redundancy for a state machine implemented in an integrated circuit according to an embodiment the present invention is shown. In particular, the circuit of FIG. 8 improves the speed of the error detection circuit 604 by using a second clock, clk2. In the embodiment of FIG. 8, clk1 is used to clock a first register 802 of the series registers, while clk2 is used to clock a second register 804, where clk2 is simply a shifted clk1. According to one embodiment, clk1 could be shifted by 180 degrees, so there only needs to be one clock signal coupled to the FFs, where the FFs can select rising or falling edges. Alternatively, clk2 can be offset from clk1 by a small phase, such as 90 degrees for example. The amount of offset can be selected to minimize the period of the state machine 602, and only needs to be larger than the transient error time. The minimum phase delay between the clocks is determined such that clk2 is clk1+Δt, where Δt is the transient error time. The period of the state machine 602 is now clk1+Δt because the value of the state must be maintained for at least the additional Δt. However, the minimized period of the state machine 602 set at clk1+Δt according to the embodiment of FIG. 8 is presumably much faster than 2*clk1. Since the values in first register 802 and second register 804 are identical during correct operation, the state feedback value can be sourced from either one.

Figure 9:
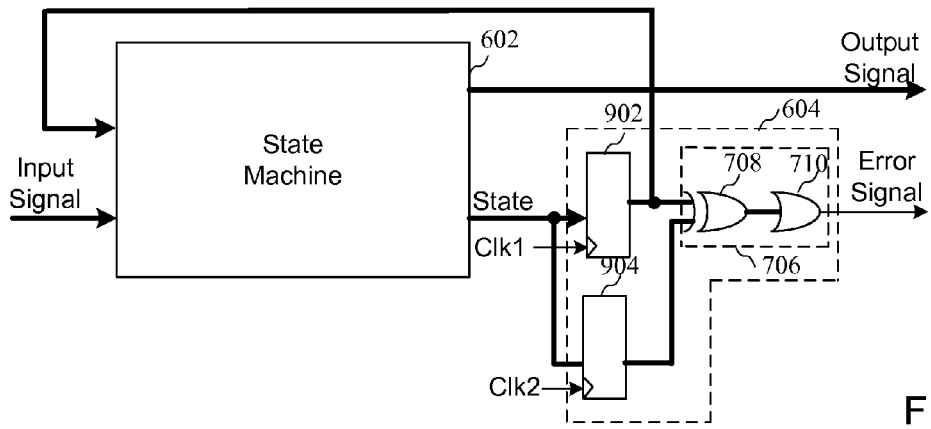
FIG. 9 is a block diagram of a circuit coupled to receive a plurality of clock signals and provide temporal redundancy for a state machine implemented in an integrated circuit according to an alternate embodiment of the present invention.

Turning now to FIG. 9, a block diagram of a circuit coupled to receive a plurality of clock signals and provide temporal redundancy for a state machine implemented in an integrated circuit according to an alternate embodiment of the present invention is shown. FIG. 9 provides a further improvement in the error detection circuit 604, where the two states are captured by parallel registers 902 and 904 coupled to receive clk1 and clk2, respectively. Because clk1 and clk2 still vary by some Δt, the value of the state signal is captured at different times. However the state machine runs at the rate of clk1, assuming that the path through the state machine to be larger than Δt, so that there will not be a write hazard.

Figure 10:
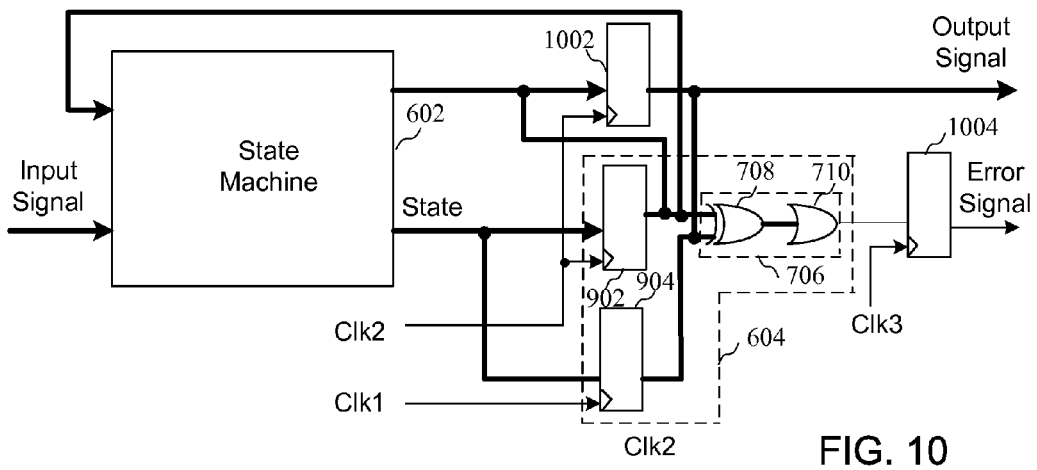
FIG. 10 is a block diagram of a circuit for providing temporal redundancy for a state machine implemented in an integrated circuit based upon an output signal and a state value according to an embodiment of the present invention.

Turning now to FIG. 10, a block diagram of a circuit for providing temporal redundancy for a state machine implemented in an integrated circuit based upon an output signal and a state value according to an embodiment of the present invention is shown. In order to identify transients on outputs, a register 1002 may be implemented at the output of the state machine 602. These registers are preferably semi-transparent latches. Because the outputs of the state machine 602 may be asynchronous, the error output is checked only when the outputs are expected to be stable. Accordingly, a register 1004 is implemented after the comparator circuit 706. The register 1004 is clocked with third clock, clk3, which is established such that the outputs are valid on clk3. It is assumed that clk3 will be later than clk2. According to the embodiment of FIG. 10, the error detection circuit 604 will generate an error signal if either an output or a state value is found to be invalid. For a Mealy state machine, in which all outputs are registered, the outputs may be treated like the state bits as set forth above.

Figure 11:
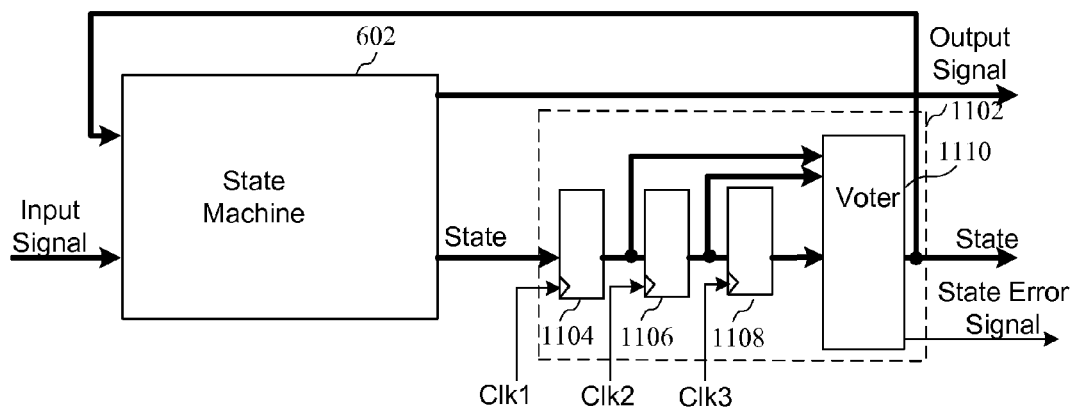
FIG. 11 is a block diagram of a circuit providing triple module redundancy for a state machine implemented in an integrated circuit according to an embodiment of the present invention.

Turning now to FIG. 11, a block diagram of a circuit providing triple module redundancy for a state machine implemented in an integrated circuit according to an embodiment of the present invention is shown. While two values of the state signal have been compared in the embodiments of FIGS. 5-10, a greater number of state values may be compared to enable error correction. According to the embodiment of FIG. 11, an error correction circuit 1102 comprises at least three registers, shown here as registers 1104-1108 coupled in series and clocked by three different clock signals. A voter circuit 1110 coupled to receive the output of each of the registers 1104-1108 will select the correct state which is used as an input to the state machine 602. The correct state may be determined by a majority vote, for example, or some other criteria which may depend upon the number of registers in the error correction circuit 1102.

Figure 12:
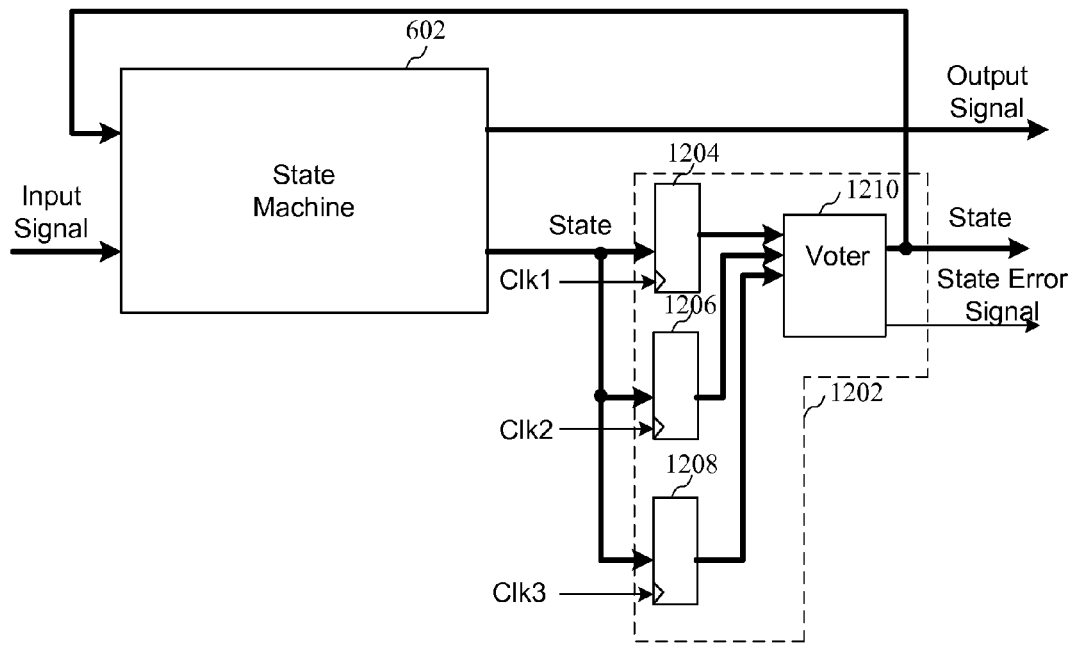
FIG. 12 is a block diagram of a circuit providing triple module redundancy for a state machine implemented in an integrated circuit according to an alternate embodiment of the present invention.

According to the alternate embodiment of FIG. 12, an error correction circuit 1202 comprises at least three registers, shown here as registers 1204-1208 coupled in series and clocked by three different clock signals. A voter circuit coupled to receive the output of each of the registers 1204-1208 will select the correct state which is used as an input to the state machine 602. As described above in reference to FIG. 9, the use of the parallel registers enables the state machine to run at the rate of clk1, assuming that the path through the state machine to be larger than a Δt between clk1 and clk3. While the embodiments of FIGS. 7-9 and 11-12 relate to state machines, the error correction circuits of FIGS. 11-12 comprising a voter circuit could be implemented to detect an error in an output signal as shown in FIG. 5 or both an output signal and state value as shown in FIG. 10.

Figure 13:
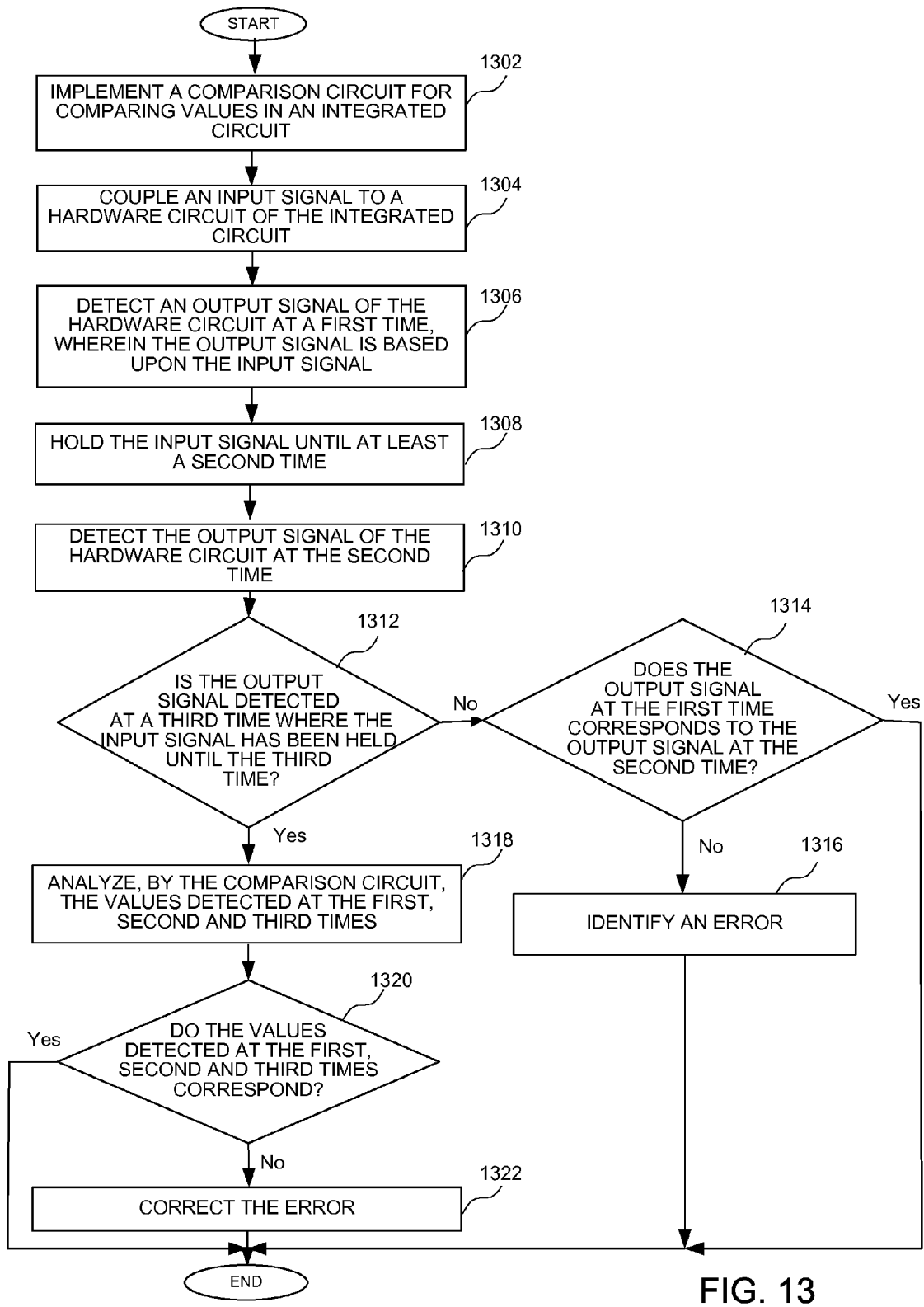
FIG. 13 is a method of providing temporal redundancy for a hardware circuit implemented in an integrated circuit based according to an embodiment of the present invention.

Turning now to FIG. 13, a method of providing temporal redundancy for a hardware circuit implemented in an integrated circuit based according to an embodiment of the present invention is shown. The methods of FIG. 13, as well as the method of FIG. 14 described below, may be implemented using any of the circuits of FIGS. 1-12 as described above or other suitable circuits. In particular, a comparison circuit for comparing values in the integrated circuit is implemented at a step 1302. An input signal is coupled to the hardware circuit at a step 1304. An output signal of the hardware circuit is detected at a first time, wherein the output signal is based upon the input signal at a step 1306. The input signal is held until at least a second time at a step 1308. The output signal of the hardware circuit is detected at the second time at a step 1310. The output signals could be detected using the registers and comparators as described above, or using other suitable circuits. It is then determined whether the output signal is detected at a third time at a step 1312, where the input signal has been held until the third time. If not, it is determined whether the output signal of the hardware circuit at the first time corresponds to the output signal of the hardware circuit at the second time at a step 1314. If the output signals do not correspond, an error is identified at a step 1316. If the output signal is detected at the third time at step 1312, the values detected at the first, second and third times are analyzed, by the comparison circuit, at a step 1320. It is then determined whether the values detected at the first, second and third times correspond at a step 1318. If not, the error is corrected at a step 1322. The errors may be corrected using a majority rule, for example.

Figure 14:
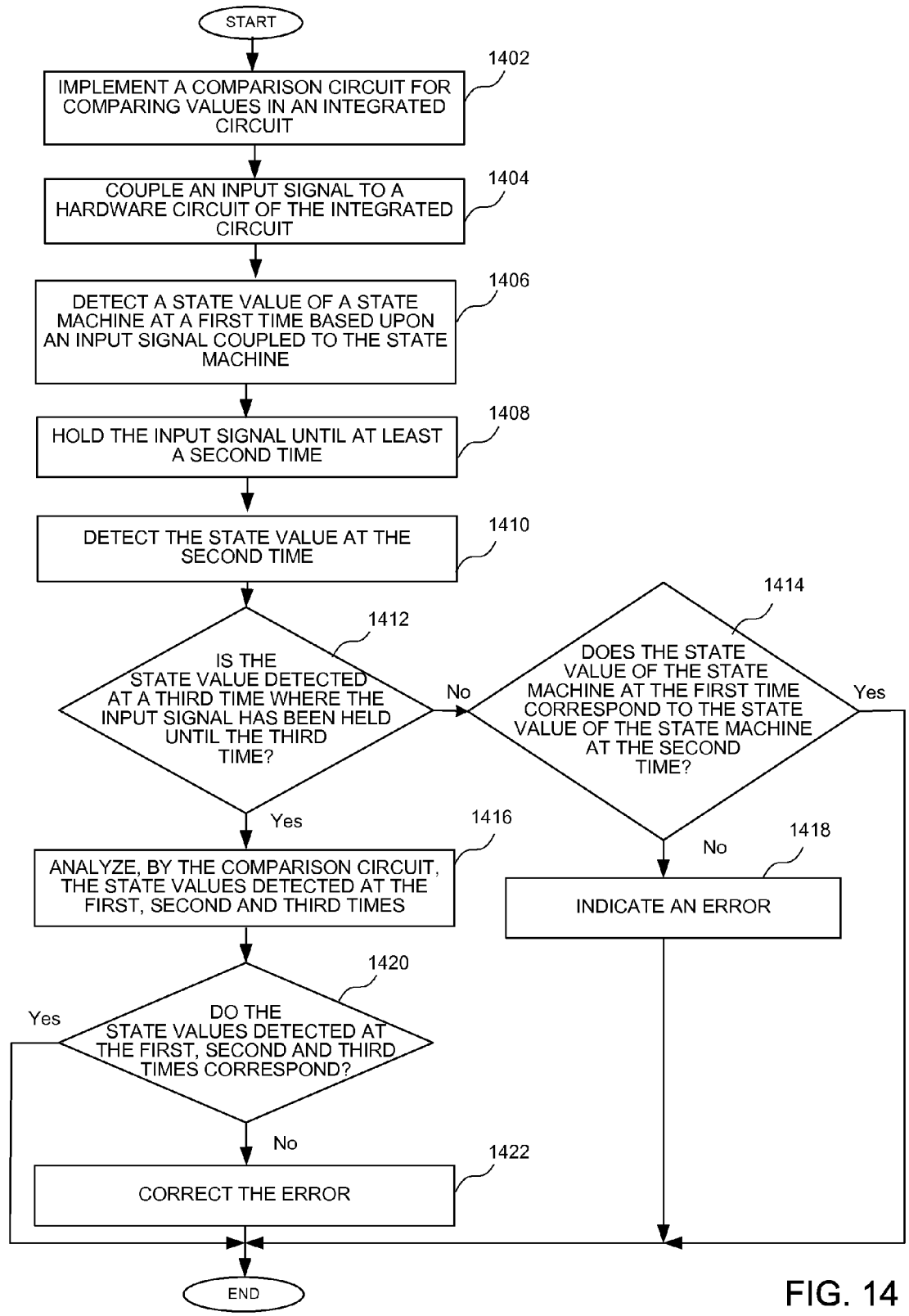
FIG. 14 is a method of providing temporal redundancy for a state machine implemented in hardware in an integrated circuit based according to an embodiment the present invention.

Turning now to FIG. 14, a method of providing temporal redundancy for a state machine implemented in hardware in an integrated circuit according to an embodiment of the present invention is shown. A comparison circuit for comparing values in an integrated circuit is implemented at a step 1402. An input signal is coupled to a state machine implemented in hardware in the integrated circuit at a step 1404. A state value of the state machine at a first time is detected based upon the input signal coupled to the state machine at a step 1406. The input signal is held until at least a second time at a step 1408. The state value is detected at the second time at a step 1410. It is then determined whether the state value is detected at a third time, where the input signal has been held until the third time at a step 1412. If not, it is then determined whether the state value of the state machine at the first time corresponds to the state value of the state machine at the second time at a step 1414. If the state values do not correspond, an error is indicated at a step 1416. If the state value is detected at a third time, the values detected at the first, second and third times are analyzed by the comparison circuit at a step 1420. It is then determined if the values detected at the first, second and third times correspond at a step 1418. If not, the error is corrected at a step 1422. While the embodiment of FIG. 14 relates to detecting an error in a state value, it should be understood that the method of FIG. 14 could be implemented in conjunction with a method for detecting or correcting an error at the output of the state machine.

It can therefore be appreciated that the new and novel method of and circuit for providing temporal redundancy for a hardware circuit implemented in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of providing temporal redundancy for a hardware circuit implemented in an integrated circuit, the method comprising:

implementing a comparison circuit for comparing values in the integrated circuit;
coupling an input signal to a state machine;
detecting a state value at a first time and at a second time;
detecting an output signal of the state machine at the second time, wherein the output signal is based upon the input signal;
holding the input signal until at least the second time;
detecting the output signal of the state machine at a third time;
determining, by the comparison circuit, whether the output signal of the state machine at the second time corresponds to the output signal of the state machine at the third time; and
determining, by the comparison circuit, whether the state value of the state machine at the first time corresponds to the state value of the state machine at the second time.

2. The method of claim 1, wherein detecting the output signal of the state machine at the second time comprises detecting the output signal based upon a clock pulse of a first clock signal and detecting the output signal of the state machine at the third time comprises detecting the output signal based upon a clock pulse of a second clock signal.

3. The method of claim 1, further comprising holding the input signal until at least the third time and detecting the state value of the state machine at a third time to provide a feedback state value based upon a majority rule.

4. The method of claim 1, wherein detecting an output signal of the state machine at the second time and detecting the output signal of the state machine at the third time comprises detecting values stored in parallel registers coupled to receive the output signal of the state machine.

5. The method of claim 4, wherein the parallel registers comprise three registers, the method further comprising holding the input signal until at least the third time and detecting an output signal of the state machine at the third time to provide an output value based upon a majority rule.

6. A method of providing temporal redundancy for a hardware circuit implemented in an integrated circuit, the method comprising:

implementing a comparison circuit for comparing values in the integrated circuit;
coupling an input signal to a state machine implemented in hardware in the integrated circuit;
detecting a state value of the state machine at a first time based upon the input signal coupled to the state machine;
holding the input signal until at least a second time;
detecting the state value at the second time;
detecting an output value of the state machine at the second time;
determining, by the comparison circuit, whether the state value of the state machine at the first time corresponds to the state value of the state machine at the second time and whether the output value of the state machine at the second time corresponds to the output value of the state machine at a third time; and
generating an error signal based upon determining whether the state value of the state machine at the first time corresponds to the state value of the state machine at the second time and whether the output value of the state machine at the second time corresponds to the output value of the state machine at the third time.

7. The method of claim 6, wherein detecting the state value of the state machine at the first time and at the second time comprises detecting the state value based upon first and second clock pulses of a clock signal.

8. The method of claim 6, wherein detecting the state value of the state machine at the first time comprises detecting the state value based upon a first clock pulse of a first clock signal and detecting the state value of the state machine at the second time comprises detecting the state value based upon a second clock pulse of a second clock signal.

9. The method of claim 6, wherein detecting the state value of the state machine at the first time and detecting the state value of the state machine at the second time comprises detecting values stored in a series of registers coupled to receive the state value of the state machine.

10. The method of claim 9, further comprising comparing the state value of the state machine at the first time and to the state value of the state machine at the second time.

11. The method of claim 6, wherein detecting the state value of the state machine at the first time and detecting the state value of the state machine at the second time comprises detecting values stored in parallel registers coupled to receive the state value of the state machine.

12. The method of claim 11, further comprising determining the state value of the state machine at the third time to provide an output value based upon a majority rule of the state values stored in the parallel registers at the first, second and third times.

13. A circuit for providing temporal redundancy for a hardware circuit implemented in an integrated circuit, the method comprising:

an input of a state machine coupled to receive an input signal;

a first register coupled to receive a state value generated by the state machine at a first time based upon the input signal;

a second register coupled to receive the state value generated by the state machine at a second time, wherein the input signal coupled to the input of the state machine at the first time is held at least until the second time;

a third register coupled to receive an output signal of the state machine;

a comparison circuit coupled to the first register, the second register, and the third register; and a fourth register coupled to an output of the comparison circuit, wherein the fourth register generates an error signal based upon a comparison of the state value generated by the state machine at the first time and the state value generated by the state machine at the second time and a comparison of the output of the state machine generated at the second time and the output of the state machine generated at a third time.

14. The circuit of claim 13, wherein first register and the second register are coupled in series.

15. The circuit of claim 13, wherein first register and the second register are coupled in parallel.

16. The circuit of claim 13, wherein integrated circuit comprises a device having programmable logic and the state machine is implemented in programmable logic of the device.

\* \* \* \* \*